United States Patent [19]
Lopatin et al.

[11] Patent Number: 6,096,648
[45] Date of Patent: Aug. 1, 2000

[54] COPPER/LOW DIELECTRIC INTERCONNECT FORMATION WITH REDUCED ELECTROMIGRATION

[75] Inventors: Sergey Lopatin, Santa Clara; Takeshi Nogami, Sunnyvale; Robin W. Cheung; Christy Mei-Chu Woo, both of Cupertino; Guarionex Morales, Sunnyvale, all of Calif.

[73] Assignee: AMD, Sunnyvale, Calif.

[21] Appl. No.: 09/237,584

[22] Filed: Jan. 26, 1999

[51] Int. Cl.$^7$ .......................... H01L 21/44; H01L 21/4763
[52] U.S. Cl. .......................... 438/687; 438/618; 438/622; 438/623; 438/627; 438/637; 438/653; 438/659; 438/674; 438/678
[58] Field of Search ...................................... 438/687, 678, 438/653, 659, 660, 643, 644, 642, 622, 618, 625, 627, 623, 637

[56] References Cited

U.S. PATENT DOCUMENTS 5,071,518  12/1991  Pan ........................................... 438/678
5,969,422  10/1999  Ting et al. ............................... 257/762

OTHER PUBLICATIONS

White et al, "Large Format Fabrication—A practical Approach to Low Cost MCM–D", IEEE Transactions on Components, Packaging, and Manufacturing Technology—Part B, vol. 18, No. 1, Feb. 1995.

*Primary Examiner*—Charles Bowers
*Assistant Examiner*—Thanhha Pham
*Attorney, Agent, or Firm*—Brinks Hofer Gilson & Lione

[57] ABSTRACT

A method of metallizing a semiconductor chip with copper including an inlaid low dielectric constant layer. The method includes the step of depositing a barrier layer on the surface of the semiconductor chip. Next, a copper seed layer is deposited on the barrier layer, and then the copper seed layer is annealed. Microlithography is then performed on the semiconductor chip to form a plurality of wiring line paths with a patterned photoresist layer. After the wiring line paths are formed a copper conductive layer is electroplated to the surface of the semiconductor chip. Next, the patterned photoresist layer is stripped off of the surface of the semiconductor chip. In addition, portions of the barrier layer and the copper seed layer that were covered by the patterned photoresist layer are also removed. A low dielectric constant layer is then deposited on the semiconductor chip to fill the gaps between the newly created copper conductive lines.

18 Claims, 3 Drawing Sheets

COPPER/LOW DIELECTRIC INTERCONNECT FORMATION WITH REDUCED ELECTROMIGRATION

FIELD OF INVENTION

The present invention relates generally to the fabrication of metal conductive lines and the filling of vias in semiconductor chips, and more particularly, to a method of using copper to interconnect integrated circuit component parts in conjunction with a low dielectric constant material used as a gap filler.

BACKGROUND OF THE INVENTION

The need for high performance semiconductor chips has continued to increase over the past several years. As the demand for better performance and faster semiconductor chips increases, so does the effort to reduce the size of semiconductor chips. Reducing the size of individual integrated circuit component parts can dramatically increase the speed and performance of a semiconductor chip. For example, smaller gate lengths in MOS transistors dramatically increases the switching speed of MOS transistors. The performance of semiconductor chips is limited by the electrical conductivity of the metal interconnects which electrically connect the various component parts that are contained in integrated circuits on the semiconductor chip. Therefore, in order to take full advantage of transistors capable of operating at faster speeds the electrical interconnects must be highly conductive, yet low in resistance.

In prior art metallization processes, aluminum or an aluminum alloy, was widely used as the preferred metallization metal. Metallization is the term used in the semiconductor industry to generally describe the process of "wiring" the component parts of an integrated circuit together. Aluminum emerged as the preferred metal for metallization because it has a relatively low resistivity (2.7 $\mu\Omega$/cm), a good current-carrying density, superior adhesion to silicon dioxide qualities, is available in high purity and has a natural low contact resistance with silicon. However, aluminum and aluminum alloys suffer from eutectic formations, thermally induced voiding and electromigration when used in very large scale integration ("VLSI") and ultra large scale integration ("ULSI") semiconductor chips.

Copper metal has begun to replace aluminum and aluminum-silicon alloys in VLSI and ULSI metallization because it has better conductivity and is more reliable than other metals, such as aluminum and aluminum alloys. The use of electroplating techniques for performing metallization using copper is especially appealing because of low cost, high throughput, high quality of the deposited copper film and excellent via filling capabilities. Although aluminum has a resistance that can be tolerated by most integrated circuits, it is difficult to deposit in a high aspect ratio. Copper is capable of being deposited with high aspect ratios. Copper is also a much better conductor than aluminum, provides good step coverage, is more resistant to electromigration and can be deposited at low temperatures. However, copper will still diffuse into silicon if applied directly to the silicon without first applying a barrier layer between the silicon layer and the copper layer.

Damascene is an interconnection fabrication process in which grooves are formed in an insulating layer and filled with metal to form the conductive lines that interconnect the component parts of the integrated circuit. Dual damascene is a multi-level interconnection process in which, via openings are formed in addition to forming the grooves of single damascene. Conductive lines are then deposited that interconnect the active and passive elements of the integrated circuit contained on the semiconductor chip.

A need exists in the semiconductor industry for methods of reducing electromigration in semiconductor devices. In addition, a need exists for a method of depositing a copper conductive layer with a low stress value and with strongly face-centered cubic <111> oriented copper lines and via structures.

SUMMARY OF THE INVENTION

The present invention discloses a metallization method that begins with providing at least one semiconductor chip, which has component parts that need to be interconnected prefabricated on the semiconductor chip. The semiconductor chip includes a silicon layer that has a dielectric layer applied to the surface of the silicon layer. Next, a barrier layer is deposited on the surface of the dielectric layer, after which, a copper seed layer is deposited on the barrier layer. After the copper seed layer is deposited, the semiconductor chip may be annealed to restore any crystal damage that might have occurred when the copper seed layer and the barrier layer were deposited, and to control copper film properties. For example, vacuum annealed copper seed layers have enhanced <111> crystal orientation, large grain size and low stress.

After the annealing step, the semiconductor chip goes through a microlithography process, which uses a mask to pattern the wiring lines with a photoresist layer. The mask determines what portion of the photoresist layer is removed. Next, a copper conductive layer is electroplated on the surface of the semiconductor chip, which interconnects the component parts of the semiconductor chip. During the electroplating process the copper will not stick to the photoresist layer that remains on the semiconductor chip after the microlithography process. However, where the photoresist is removed the copper will stick, which forms the copper conductive layer.

The method of electroplating copper on a vacuum annealed copper seed layer provides: strong <111> crystal orientation, low stress in the copper film, eliminates recrystallization at room temperature, provides large grain size of copper film, which lead to bamboo grain types in selected deposited lines. These properties lead to reduced electromigration in copper lines.

After the copper conductive layer is electroplated on the surface of the semiconductor chip, the remaining portion of the photoresist layer that was not removed during the microlithography process is stripped off. Once the remaining photoresist layer is stripped off, various copper lines will remain on the areas that were not covered by the photoresist; also, in the case of dual damascene manufacturing, any vias on the semiconductor chip will be filled. In addition to stripping off the remaining portions of the photoresist layer, the copper seed layer and the barrier layer that were below the remaining photoresist layer are also removed. However, portions of the copper seed layer and the barrier layer that are located below the newly created copper lines and filled vias are not stripped during this step, and will remain below the copper lines and vias that have been formed on the semiconductor chip during electroplating.

A low dielectric constant layer is then deposited on the surface of the semiconductor chip. The low dielectric constant layer fills the gaps between the newly formed copper lines with a non-conductive material. These gaps are filled with the low dielectric constant material to protect the copper lines from shorting or building up charges between the copper lines during operation. An optional step, but not a required step, after deposition of the low dielectric constant layer, is to use chemical mechanical polishing ("CMP") to planarize the low dielectric constant layer.

An important feature of copper is that it is an extremely good conductor, which means signals being sent over the copper lines are not slowed as much as in the case of semiconductor chips using aluminum or aluminum alloys. Using the disclosed method allows copper to be electroplated on the semiconductor chip with strongly face-centered cubic <111> oriented copper lines and via structures. Another advantage is reduced electromigration of the copper interconnect structure due to the grain size of the deposited copper layer. Further, the copper conductive layer has a low stress factor and eliminates recrystallization of the copper at room temperature.

These and other features and advantages of the invention will become apparent upon consideration of the following detailed description of the presently preferred embodiments of the invention, viewed in conjunction with the appended drawings.

DETAILED DESCRIPTION OF THE PRESENTLY PREFERRED EMBODIMENTS OF THE INVENTION

FIGS. 1–6 illustrate, in a cross-section view, process steps for the fabrication of a copper interconnect structure in conjunction with an inlaid low dielectric constant layer in accordance with one preferred embodiment of the present invention. The figures illustrate the formation of an inlaid copper interconnect in a low dielectric constant body. Although not illustrated in FIGS. 1–6, one skilled in the art of semiconductor manufacturing would recognize that a typical semiconductor chip may contain thousands of electrically coupled component parts. The electrically coupled component parts may include transistors, resistors, capacitors and various other types of logic components.

Figure 1:
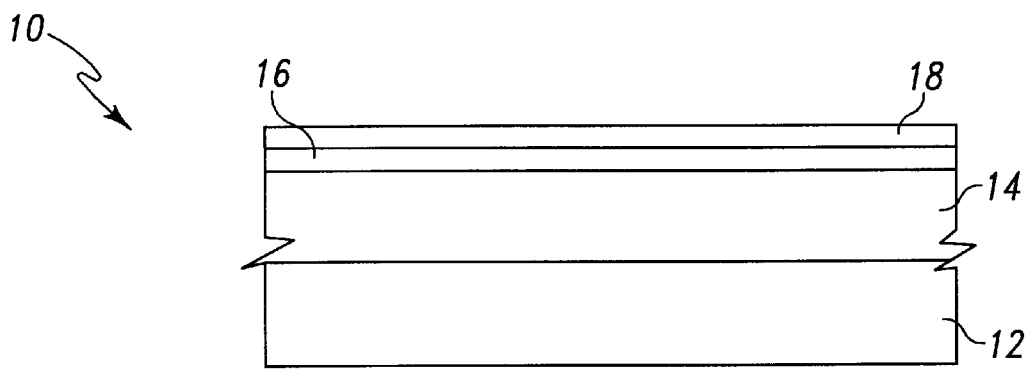
FIG. 1 is a cross-sectional view of a portion of a semiconductor chip.

Referring to FIG. 1, a cross-section view of a portion of a semiconductor chip 10 is illustrated, which includes a substrate layer 12 and an overlying dielectric layer 14. As known in the art, the semiconductor chip 10, at this particular stage of manufacturing, includes a variety of integrated circuit component parts that were formed during previously completed fabrication steps. The dielectric layer 14 is deposited on the surface of the substrate layer 12 using methods known in the art, such as chemical vapor deposition ("CVD"), plasma enhanced chemical vapor deposition ("PECVD"), spin on depositing or by thermal oxidation. The dielectric layer 14 can be selected from a variety of dielectric materials, but is preferably made from silicon dioxide or some variation of silicon dioxide.

Once the dielectric layer 14 has been deposited, a barrier layer 16 is deposited on the dielectric layer 14. The barrier layer 16 is deposited on the dielectric layer 14 to prevent eutectic alloying and diffusion from occurring in the semiconductor chip 10. Materials used for the barrier layer 16 may be selected from several materials known in the art for providing a sufficient barrier between the substrate layer 12 and the metal deposited during the metallization process. The barrier materials may be selected from the group including tantalum, tantalum nitride, titanium, titanium nitride and tungsten nitride to name a few. The barrier layer 14 may be deposited on the semiconductor chip 10 using several deposition techniques known in the art such as evaporation, ion-metal plasma ("IMP"), CVD or physical vapor deposition ("PVD").

The next layer deposited on the semiconductor chip 10 is a copper seed layer 18. The copper seed layer 18 is deposited because copper does not tend to adhere well to barrier metals. This is because oxides tend to form on top of the barrier layer 16 before copper can be electrochemically deposited on the barrier layer 16. The copper seed layer 18 is deposited on the barrier layer 16 to solve the problems associated with copper not adhering well to the barrier layer 16. Like the barrier layer 16, the copper seed layer 18 may be deposited on the semiconductor chip 10 using deposition techniques known in the art such as evaporation, IMP, CVD, PVD or PECVD.

After the barrier layer 16 and the copper seed layer 18 are deposited, the semiconductor chip 10 may be annealed. During the process of depositing the various layers of material on the substrate layer 12, the wafer crystal structure of the substrate layer 12 may be get damaged at various locations. Generally, three basic types of damage occur: lattice damage, damage cluster and vacancy-interstitial. Restoration of the crystal structures that were damaged during the previously disclosed deposition steps can be achieved by a thermal heating step, which is commonly referred to as annealing. Methods of annealing semiconductor chips to repair crystal damage are known in the art of semiconductor manufacturing. Annealing processes improves the properties of the copper seed layer and the electroplated copper film, such as grain size, crystal orientation, stress and recrystallization.

Figure 2:
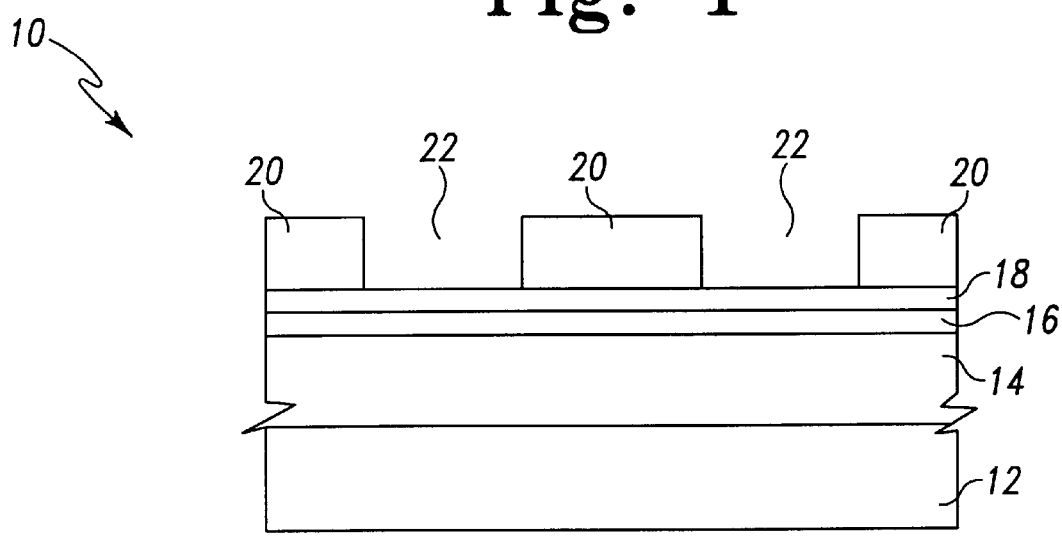
FIG. 2 is a cross-sectional view of the semiconductor chip depicted in FIG. 1 with an etched photoresist layer.

Referring generally to FIG. 2, after the optional annealing process, a photoresist layer 20 is deposited and then patterned on the copper seed layer 18. As known in the art, patterning is done using a microlithography process, which is also commonly referred to as photomasking, masking or photolithography. Microlithography is a multi-step pattern transfer process similar to stenciling that actually places the pattern of conductive lines on the surface of the semiconductor chip 10.

In general, during the microlithography process a circuit pattern or reticle is placed on the surface of the photoresist layer 20 and the semiconductor chip 10, together with the reticle, is exposed to a light source. As known in the art, photoresists are light-sensitive materials that have physical properties that change when exposed to light. For example, when some types of photoresists are exposed to light through the reticle, the portion of the photoresist layer that is exposed and not covered by the reticle changes from a soluble condition to an insoluble condition. As illustrated in FIG. 2, removing the soluble portion with chemical solvents or developers leaves a plurality of cavities 22 in the photoresist layer 20 that corresponds to the pattern contained in the reticle. Likewise, other types of photoresists are deposited in a soluble condition on the semiconductor chip 10 until exposed to light, which causes the photoresist to change into an insoluble condition.

Figure 3:
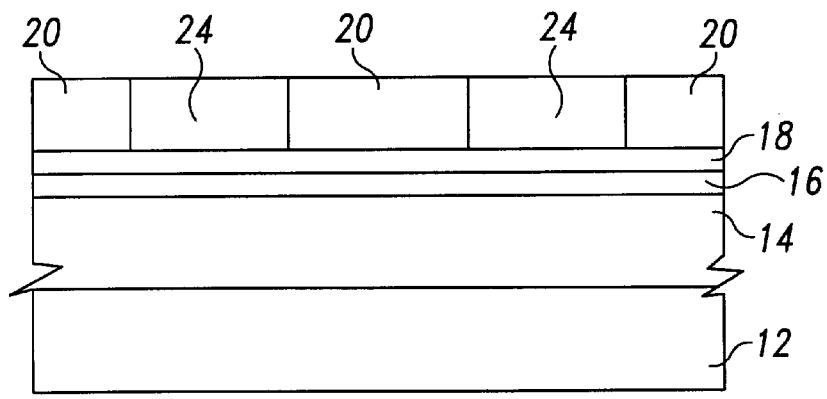
FIG. 3 is a cross-sectional view of the semiconductor chip depicted in FIG. 2 including a copper conductive layer.

Referring to FIGS. 2 and 3, after the various cavities 22 have been patterned in the photoresist layer 20 during the microlithography process, a copper conductive layer 24 is electroplated on the semiconductor chip 10. The copper conductive layer 24 interconnects the component parts of the integrated circuit by forming copper lines where the portions of the photoresist layer 20 have been removed. During the electroplating process, the copper ions contained in the electrolytic solution will not adhere to the photoresist layer 20.

In order to plate a precious metal on the surface of an object, an electrolytic cell is typically used. Although not illustrated, the basic design of an electrolytic cell includes a cathode, an anode, a current source and an aqueous electrolyte. The aqueous electrolytic solution contains dissolved precious metals such as copper or gold. The cathode, the anode and the semiconductor chip 10 are immersed in the aqueous electrolytic solution. When current is provided to the electrolytic solution, by providing a charge across the anode and the cathode, the metal ions contained in the aqueous electrolytic solution are deposited on the surface of the piece to be plated. The copper ions in the electrolytic solution are plated on the semiconductor chip 10 through electric migration and diffusion, and the amount of copper deposited over a period of time is controlled by the amount of current flowing in the electrolytic solution.

Once the copper conductive layer 24 has been electroplated on the surface of the semiconductor chip 10, an optional step of transforming the copper that was deposited in the copper conductive layer 24 into a copper alloy may be desirable in some integrated circuits. Copper alloys are more resistant to electromigration than regular copper, which might be useful in some applications. In order to transform the copper into a copper alloy, small traces of impurities are implanted on the copper conductive layer 24, using methods of ion implantation known in the art. Examples of impurities that may be implanted to create the copper alloy include materials such as magnesium, boron, tin and zirconium. The preferred implant dose is about $1 \times 10E16$ atoms/cm$^2$.

The photoresist layer 20 that still remains on the semiconductor chip 10 serves as an implant barrier to the underlying dielectric layer 14. The implanted ions will become activated in the first annealing or deposition process that requires an elevated temperature after being implanted. The temperature ranges for activating the implanted metal ions is about 250° C. to 450° C.

The next step in the metallization process is to remove the photoresist layer 20 that remains between the copper conductive layer 24 that was deposited during the electroplating step. As previously set forth, after undergoing the microlithography process some portions of the photoresist layer 20 still remains on the semiconductor chip 10. Copper ions do not stick to the photoresist layer 20 during the electrochemical deposition process and therefore copper is not deposited in these areas. Methods for removing photoresist layers 20 are known in the art. Once the photoresist layer 20 is removed, only conductive copper lines that are formed by the copper conductive layer 24 remain on the semiconductor chip 10.

Figure 4:
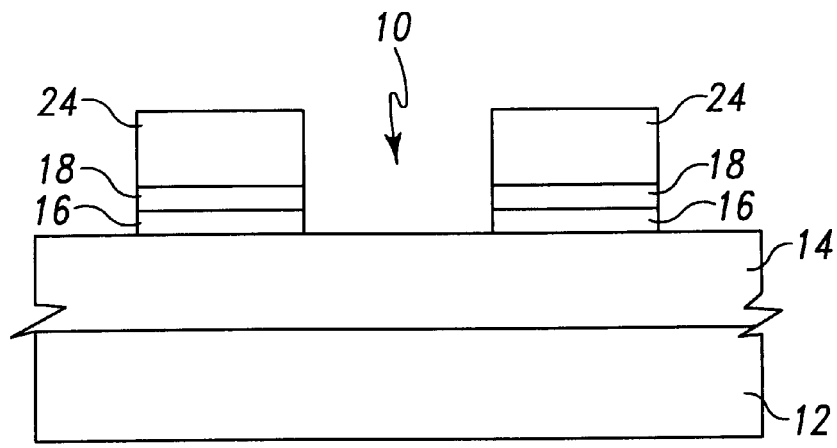
FIG. 4 is a cross-sectional view of the semiconductor chip depicted in FIG. 3 with certain deposited layers removed.
Figure 5:
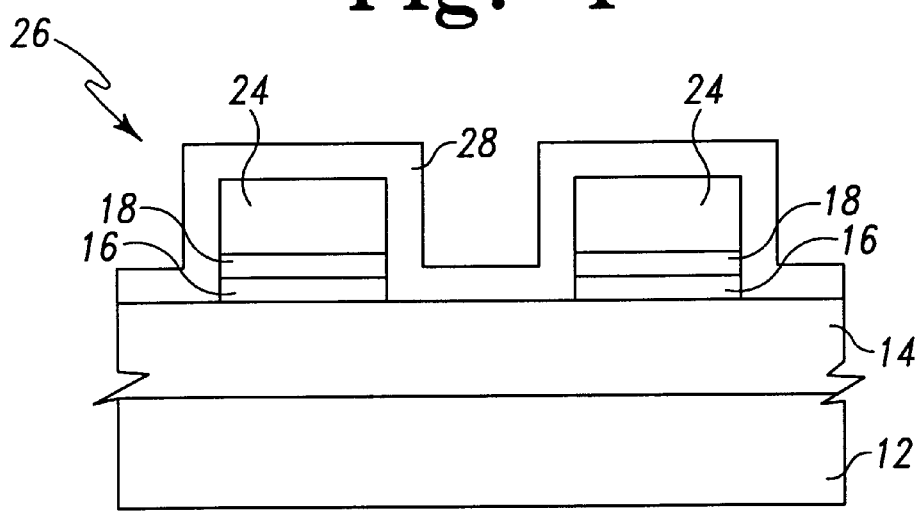
FIG. 5 is a cross-sectional view of a semiconductor chip with a non-conductive oxide layer.

As illustrated in FIG. 4, after the photoresist layer 20 is removed, portions of the copper seed layer 18 and the barrier layer 16 that were covered by the photoresist layer 20 during the electrochemical deposition process are removed. Methods of removing the unwanted portions of the copper seed layer 18 and the barrier layer 16 are known in the art. Examples of methods that might be used to remove these layers include wet chemical etching, reactive ion etching, electrolytic polishing or by converting the copper seed layer 18 and the barrier layer 16 into a non-conductive oxide using an anodization process. FIG. 5 represents an illustration of a semiconductor chip 26 that has a non-conductive oxide layer 28 that was formed using an anodization process.

Figure 6:
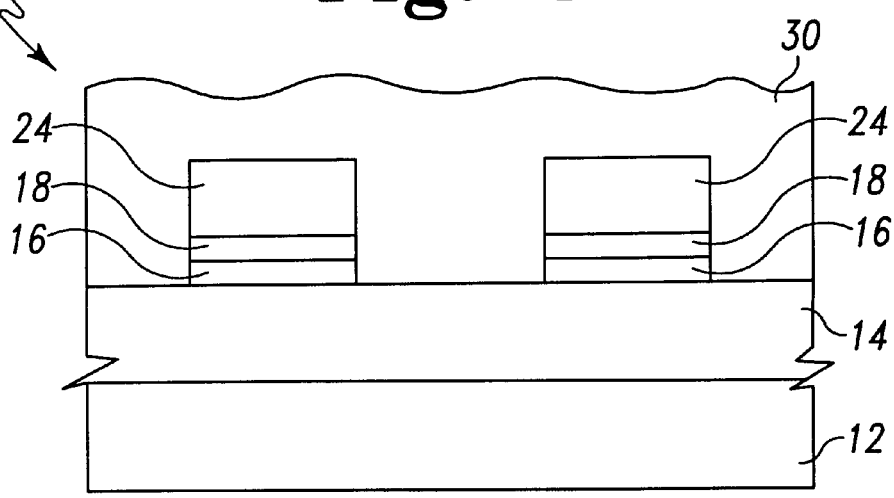
FIG. 6 is a cross-sectional view of the semiconductor chip depicted in FIG. 4 with a low dielectric constant layer.

The remaining copper conductive layer 24 appears like islands on the surface of the semiconductor chip 10 after the unwanted portions of the barrier layer 16 and the copper seed layer 18 are removed. Referring to FIG. 6, the next step is to deposit a low dielectric constant layer 30 on the surface of the semiconductor chip 10. The low dielectric constant layer 30 may be deposited using spin-on deposition techniques or through other deposition techniques. The low dielectric constant layer 30 covers the surface of the semiconductor chip 10, including the copper conductive layer 24. Some low dielectric constant materials include hydrogen silsesquioxane ("HSQ"), methyl silsesquioxane ("MSQ"), benzocyclobutene ("BCB"), flourinated aromatic ether ("FLARE"), SILK™, NANOGLASS™ and fluorinated glass ("FSG").

Figure 7:
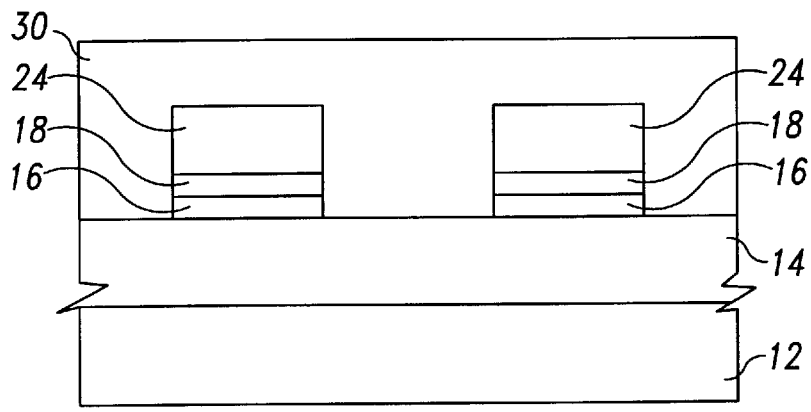
FIG. 7 is a cross-sectional view of the semiconductor chip depicted in FIG. 6 with a polished low dielectric constant layer.

In FIG. 7, the semiconductor chip 10 is illustrated after the low dielectric constant layer 30 has been planarized. The low dielectric constant layer 30 may be planarized using methods known in the art such as chemical mechanical polishing ("CMP"). Although not illustrated, another method of planarizing the low dielectric constant layer 30 is to deposit a photoresist layer on the surface of the dielectric constant layer 30. This photoresist layer evens out any bumps created by deposition of the low dielectric constant layer 30. If further planarization is required after the photoresist layer is deposited, the photoresist layer together with a portion of the low dielectric constant layer 30, may be removed by reactive ion etching ("RIE"). The resulting structure, regardless of the method used to planarize the low dielectric constant layer 30, includes isolated copper conductive lines formed by the copper conductive layer 30 separated by a low dielectric constant layer 30.

Figure 8:
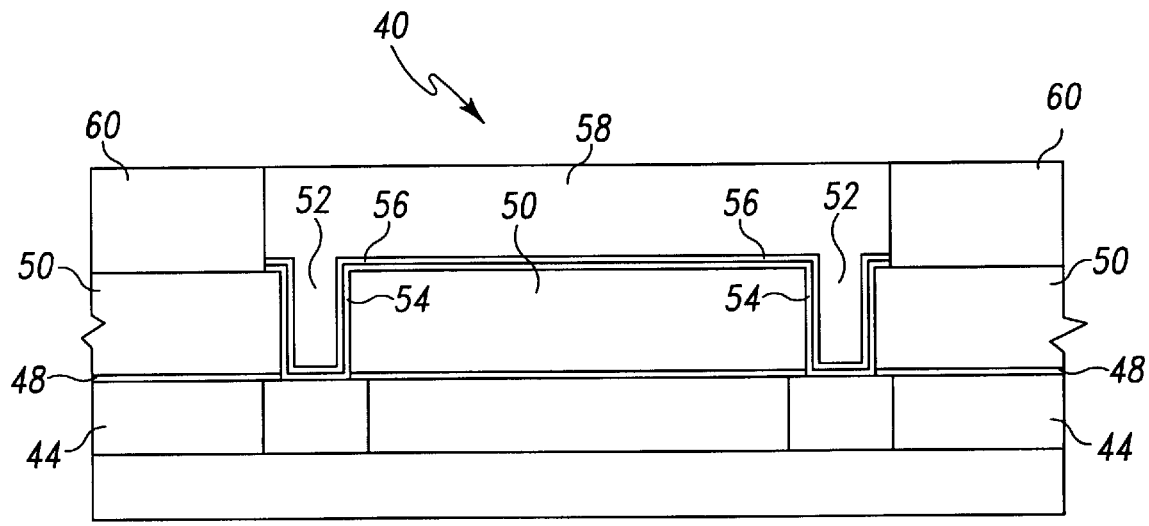
FIG. 8 is a cross sectional view of a dual damascene semiconductor chip.

As previously stated, dual damascene manufacturing is a multi-level interconnection process and the present invention is applicable to dual damascene manufacturing as well. Referring to FIG. 8, another embodiment of the present invention is illustrated that includes a dual damascene semiconductor chip 40 including a silicon substrate 42 and a dielectric layer 44 is illustrated. A plurality of integrated circuit component parts 46 are prefabricated on the semiconductor chip 40 using methods known in the art. In an alternative embodiment, the semiconductor chip 40 may also include a dielectric barrier layer 48 that is deposited on the dielectric layer 44.

The present invention relates to metallizing a semiconductor chip 40, thereby interconnecting the various integrated circuit component parts 46 of the semiconductor chip 40. The disclosed method begins with depositing a first low dielectric constant layer 50 on the semiconductor chip 40. Then, vias 52 are etched in the first low dielectric constant layer 50 with a microlithography process. The vias 52 are normally etched in the first low dielectric constant layer 50 at positions where the integrated circuit component parts 46 of the semiconductor chip 40 are located.

After the first low dielectric constant layer 50 is deposited on the semiconductor chip 40 a barrier layer 54 is deposited on the first low dielectric constant layer 50. Next, a copper seed layer 56 is deposited on the barrier layer 54 and annealed. Although not illustrated, the next step in the process is to use a microlithography process on the semiconductor chip 40 to form a plurality of wiring line paths with a patterned photoresist layer. After the patterned photoresist layer is deposited, a copper conductive layer 58 is electroplated on the semiconductor chip 40, thereby filling the vias 52 and the wiring line paths created by the photoresist layer with copper.

Once the copper conductive layer 58 is electroplated the remaining portions of the patterned photoresist layer are stripped off. In addition, portions of the barrier layer 54 and the copper seed layer 56 that were covered by the photoresist layer during the microlithography process are also removed.

After the necessary portions of the barrier layer 54 and the copper seed layer 56 have been removed, a second low dielectric constant layer 60 is deposited on the semiconductor chip 40, thereby filling the gaps between the copper wiring line paths that the copper conductive layer 58 created. Thus, as with the previous embodiment, the result of the above-referenced process is a uniformly deposited copper conductive layer 58 in conjunction with an inlaid second low dielectric constant layer 60. The semiconductor chip 40 may be polished, as set forth above, after the second low dielectric constant layer 60 is deposited.

While the invention has been described in its currently best known modes of operation and embodiments, other modes and embodiments of the invention will be apparent to those skilled in the art and are contemplated. It is therefore the following claims, including all equivalents, that are intended to define the spirit and scope of the invention.

What is claimed is:

1. A method of metallizing a semiconductor chip, comprising the steps of:
   depositing a barrier layer and a copper seed layer on the semiconductor chip;
   annealing the semiconductor chip after the copper seed layer is deposited;
   using microlithography to form a patterned photoresist layer on the copper seed layer;
   electroplating a copper conductive layer on the semiconductor chip;
   stripping off the patterned photoresist layer and portions of the barrier layer and the copper seed layer that were located beneath the patterned photoresist layer; and
   depositing a low dielectric constant layer on the semiconductor chip.

2. The method of claim 1, further including the step of planarizing the low dielectric constant layer.

3. The method of claim 1, further including the step of implanting a metal impurity in the copper conductive layer.

4. The method of claim 3, wherein said metal impurity may be selected from the group consisting of magnesium, boron, tin and zirconium.

5. The method of claim 3, wherein said implant dose is about $1 \times 10E16$ atom/cm$^2$.

6. The method of claim 1, further including the step of depositing a photoresist layer on the low dielectric constant layer.

7. A method of metallizing a semiconductor chip with copper, comprising the steps of:
   depositing a barrier layer on the surface of the semiconductor chip;
   depositing a copper seed layer on the barrier layer;
   annealing the semiconductor chip after the copper seed layer is deposited;
   performing microlithography on the semiconductor chip to form a plurality of wiring paths with a patterned photoresist layer;
   electroplating a copper conductive layer on the semiconductor chip, thereby filling the plurality of wiring paths with copper;
   stripping off the patterned photoresist layer from the surface of the semiconductor chip;
   removing portions of the barrier layer and the copper seed layer which were covered by the patterned photoresist layer; and
   depositing a low dielectric constant layer on the semiconductor chip.

8. The method of claim 7, further including the step of planarizing the low dielectric constant layer.

9. The method of claim 7, further including the step of implanting a metal impurity in the copper conductive layer.

10. The method of claim 9, wherein said metal impurity may be selected from the group consisting of magnesium, boron, tin and zirconium.

11. The method of claim 9, wherein said implant dose is about $1 \times 10E16$ atoms/cm$^2$.

12. The method of claim 7, further including the step of depositing a photoresist layer on the low dielectric constant layer.

13. A method of metallizing a semiconductor chip with copper, comprising the steps of:
   depositing a first low dielectric constant layer on a semiconductor chip, said semiconductor chip including a substrate layer, a dielectric layer and a plurality of integrated circuit components;
   etching at least one via opening in the first low dielectric constant layer to form passages to said integrated circuit components;
   depositing a barrier layer on the first low dielectric layer so that said barrier layer is deposited in said via openings;
   depositing a copper seed layer on the barrier layer;
   annealing the semiconductor chip after the copper seed layer is deposited;
   performing microlithography on the semiconductor chip to form a plurality of wiring line paths with a patterned photoresist layer;
   electroplating a copper conductive layer on the surface of the semiconductor chip, thereby filling the vias and the plurality of wiring line paths with copper;
   stripping off the patterned photoresist layer from the surface of the semiconductor chip;
   removing portions of the barrier layer and the copper seed layer that were covered by the patterned photoresist layer; and
   depositing a second low dielectric constant layer on the semiconductor chip thereby filling the gaps between said copper wiring path lines.

14. The method of claim 13, further including the step of planarizing the second low dielectric constant layer.

15. The method of claim 13, further including the step of implanting a metal impurity in the copper conductive layer.

16. The method of claim 15, wherein said metal impurity may be selected from the group consisting of magnesium, boron, tin and zirconium.

17. The method of claim 15, wherein said implant dose is about $1 \times 10E16$ atoms/cm$^2$.

18. The method of claim 13, further including the step of depositing a photoresist layer on the second low dielectric constant layer.

* * * * *

UNITED STATES PATENT AND TRADEMARK OFFICE
CERTIFICATE OF CORRECTION

PATENT NO. : 6,096,648
DATED : August 1, 2000
INVENTOR(S) : Sergey Lopatin et al.

It is certified that error appears in the above-identified patent and that said Letters Patent are hereby corrected as shown below:

At column 7, line 64, please delete "atom" and insert in lieu thereof --atoms--.

Signed and Sealed this

Twenty-fourth Day of April, 2001

Attest:

NICHOLAS P. GODICI

Attesting Officer

Acting Director of the United States Patent and Trademark Office